ADJUSTABLE FREQUENCY ATOMIC FREQUENCY STANDARD

Filed Feb. 18, 1966 2 Sheets-Sheet 1

INVENTOR.
JAMES T. ARNOLD
BY
Wm. Nolan
ATTORNEY

INVENTOR.
JAMES T. ARNOLD
BY Wm J. Nolan
ATTORNEY

United States Patent Office 3,363,193

Patented Jan. 9, 1968

3,363,193

ADJUSTABLE FREQUENCY ATOMIC FREQUENCY STANDARD

James T. Arnold, Los Gatos, Calif., assignor to Varian Associates, Palo Alto, Calif., a corporation of California Filed Feb. 18, 1966, Ser. No. 528,649

16 Claims. (Cl. 331—3)

ABSTRACT OF THE DISCLOSURE

A first oscillator operated to provide a selected frequency is coupled to a phase modulator and an adjustable frequency divider. The adjustable frequency divider selectively divides the first oscillator's frequency to provide an adjustable reference frequency signal. The frequency of the signal provided by a second oscillator is locked to the reference frequency signal. The phase modulator issues a phase modulated signal whose frequency is multiplied by a frequency multiplier. The outputs from the frequency multiplier and second oscillator are summed in a mixer and then coupled to induced atomic state transitions in a $Rb^{87}$ gas absorption cell. The transparency of the absorption cell is monitored for controlling the frequency generated by the first oscillator in accordance with variations in the transparency of the absorption cell.

This invention relates to frequency stabilization apparatus, and more particularly to atomic frequency standard stabilization apparatus in which the output frequency of the standard can be selectively offset.

Atomic frequency standard devices have been developed which exhibit a long term frequency stability of $\pm 1 \times 10^{-10}$ or better. These devices typically are coupled to synthesizers which rationalize the atomic resonance frequencies with an integer frequency relative to an internationally recognized time scale, for example, the universal time scale UT–2 established by the U.S. Naval Observatory. A frequency standard of this type is shown and described in patent application Ser. No. 448,496, a continuation application of Ser. No. 129,879, filed August 1961, now abandoned, inventors being Martin E. Packard, Robert C. Rempel, Robert J. Rorden and Byron E. Swartz; and assigned to the assignee of this application.

Unfortunately, the internationally recognized time scales do not remain fixed. Often at the end of each year it is necessary to adjust the recognized time scales to account for fluctuations in the current ephemeris time scale. For example, the UT–2 time scale generally is varied in multiples of $\pm 50$ parts in $10^{10}$. Of course, to maintain the usefulness of the atomic frequency standards, it is desirable to adjust their outputs by an equivalent amount.

Therefore, the object of this invention is to provide frequency stabilization apparatus wherein the output frequency of an atomic frequency standard can be reliably and accurately offset to permit frequency corrections corresponding to current establishment of time scales.

One feature of this invention is the provision, in an atomic frequency stabilization apparatus having an atomic frequency resonator, of a frequency generator circuit which includes a variable frequency synthesizer for translating a particular frequency adapted to alter the frequency translation by selected increments for comparison with a quantum mechanical transition frequency of the atomic frequency resonator.

Another feature of this invention is the provision, in an atomic frequency stabilization apparatus having a cavity resonator enclosed light absorption cell, of a frequency generator circuit which includes a variable frequency synthesizer for translating a particular frequency adapted to alter the frequency translation by a selected increment for application to the cavity resonator.

Another feature of this invention is the provision of an atomic frequency stabilization apparatus of the above featured type wherein the variable frequency synthesizer selectively translates a particular frequency by any of a plurality of selected frequency increments.

Another feature of this invention is the provision of an atomic frequency stabilization apparatus of the above featured types wherein the variable frequency synthesizer includes a frequency divider switching network having a plurality of switch positions which provide the plurality of selected frequency increments of translation.

Another feature of this invention is the provision of an atomic frequency stabilization apparatus of the above featured types wherein the light absorption cell is a rubidium cell and the variable frequency synthesizer is selectively adjustable to alter frequencies by increments separated by multiples of approximately 34 cycles per second (c.p.s.).

Another feature of this invention is a provision of an atomic frequency stabilization apparatus of the above featured types including an oscillator fed phase modulator and electrical circuitry for combining the output signal of the phase modulator with the selected output frequency signal of the variable frequency synthesizer and for applying the resulting composite signal to the cavity resonator.

These and other features and objects of this invention will become more apparent upon a perusal of the following specification taken in conjunction with the accompanying drawings wherein.

Figures 1, 3:
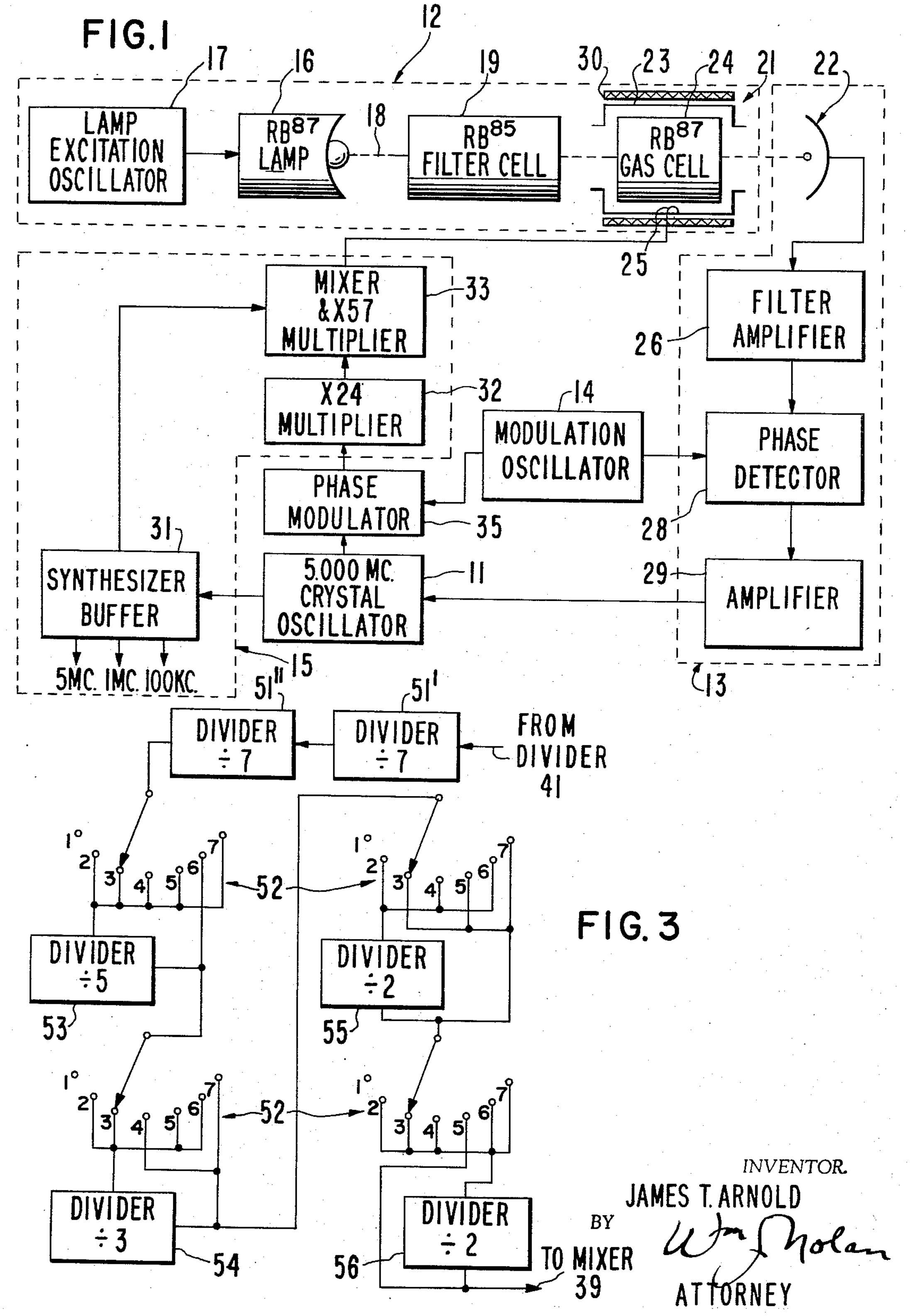
FIG. 1 is a schematic showing of an optical package and associated block diagram control circuitry for one embodiment of the invention.
FIG. 3 is a schematic diagram, partly in block form, of the frequency divider switching network shown in FIG. 2.

With reference to FIG. 1, a frequency standard whose output frequency is adjustable is provided by deriving from a variable frequency oscillator 11 a frequency signal which is electronically coupled for comparison with a quantum mechanical transition frequency, for example, the hyperfine transition frequency, of an atomic frequency standard system 12. The absorption, transmission and emission characteristics of the resonant medium of any of the passive or active atomic frequency resonators can be utilized to establish a hyperfine transition frequency signal corresponding to a particular atomic state transition thereof for comparison with the derived signal frequency. In practice, it has been found that phase comparison techniques are most convenient for accomplishing either a phase lock or a frequency lock of the frequency signal from oscillator 11 with the hyperfine transition resonance center frequency, $f_r$.

To accomplish this lock, the frequencies are compared and an error signal is generated when the derived frequency signal deviates from the hyperfine transition resonance center frequency $f_r$ of the atomic frequency resonator, the error signal being proportional to the extent of the deviation. The error signal is electronically coupled to lock oscillator 11 to the hyperfine transition resonance frequency.

As noted hereinbefore, often it is desirable to adjust the output frequency of such frequency standards. In the past, it has been the practice to adjust the frequency of the standard by varying the hyperfine transition resonance frequency characteristic of, for example, the absorption cell of an optically pumped gas resonator. This has been accomplished by altering the pressure in the gas cell or by changing the axial magnetic field usually applied to the system. Such systems are seriously inadequate for purposes of optimum flexibility and simplicity. For example, varying the frequency by altering the pressure in the gas cell generally requires the replacement of the gas cell. In the case of systems utilizing magnetic field adjustment techniques, the hyperfine transition resonance frequency characteristic of the resonator can be changed only a very small amount, for example, in the case of $Rb^{87}$ gas absorption cell resonators, not more than 100 parts in $10^{10}$, and only in the direction of increasing the hyperfine transition resonance frequency and therefore the output frequency of the standard.

The present invention provides a system wherein the output frequency of the standard can be selectively increased or decreased electronically without necessitating the replacement or modification of resonator parts. Such a system inherently is characterized by being simple and flexible. Specifically, referring again to FIG. 1, a variable frequency synthesizer circuit 15 is provided which receives the output frequency signal from oscillator 11 and responds thereto by translating the frequency signal by a selected increment to a desired derived frequency signal for comparison with the hyperfine transition resonance center frequency of the atomic frequency standard.

By maintaining the hyperfine transition resonance center frequency of the atomic frequency standard system 12 fixed, and selectively adjusting synthesizer circuit 15 to alter the increment of frequency translation of the frequency signal received from oscillator 11, relative to the hyperfine transition resonance center frequency $f_r$, the frequency locked output frequency of the variable frequency oscillator 11 will be altered by the resultant error signal by correspondingly proportionate increments.

The atomic frequency resonators have an atomic state transition characteristic which have a resonance curve of a finite width. For example, the $F=2$, $M_f=0 \rightarrow F=1$, $M_f=0$ transition of rubidium isotope 87 can have a full width at half maximum of approximately 150 cycles per second (c.p.s.). By inducing the atomic state transitions in a passive type atomic frequency resonator with a phase modulated signal derived from oscillator 11, the probability, hence the number, of transitions will be caused to vary in accordance with the instantaneous frequency deviation of the phase modulated signal from the center of the resonance curve. If the frequency of the derived transition inducing signal corresponds to the hyperfine transition resonance center frequency of the atomic frequency resonator, the number of transitions occurring will be maximum. Whereas, if the frequency of the transition inducing signal is less or greater than the hyperfine transition resonance center frequency, the number of transitions occurring will be less than maximum by an amount representative of the frequency difference. Thus, with a phase modulated transition inducing signal, more transitions will occur at the beginning or end of a period defined by the frequency of modulation depending on whether the center frequency of the phase modulated signal is less or greater than the hyperfine transition resonance center frequency.

Therefore, it is contemplated that means 13 will be provided to detect the time distribution of the transitions and compare it to a reference 14 to generate an error signal representative of the location of the center frequency of the phase modulated signal relative to the hyperfine transition resonance center frequency. If there is a difference between these center frequencies, a representative error signal is generated and coupled to the variable frequency oscillator 11 to shift its frequency such that the center frequency of the modulated signal derived therefrom corresponds to the center of the atomic state transition resonance frequency characteristic.

The manner in which incremental adjustments of the output frequency of such standards is achieved can best be understood by considering the operation of the adjustable frequency standard of the present invention. Initially, it will be assumed that the signal frequency of oscillator 11 is transformed by synthesizer 15 with an initial increment such that the resultant center frequency $f_c$ of the phase modulated signal derived from the oscillator's signal frequency corresponds to the hyperfine transition resonance center frequency $f_r$ of the resonator. The output frequency signal of oscillator 11, hence the standard, is then defined at initial frequency $f_1$. To adjust the output frequency of the standard to a new and, for example, higher frequency $f_2$ relative to $f_1$, synthesizer 15 is adjusted to transform the frequency of the signal from oscillator 11 by a new increment, less than the initial increment by an amount proportionately related to the difference between $f_1$ and the desired $f_2$. Concomitant with this new frequency transformation is a shifting of the synthesized center frequency $f_c$ to a new frequency lower than its initial value by an amount proportional the difference between $f_1$ and the desired $f_2$. Since $f_r$ and the new $f_c$ no longer coincide, an error signal is generated proportionately related to the difference between $f_r$ and $f_c$ which is coupled to oscillator 11 and causes it to oscillate at the new frequency $f_2$ (relative to $f_r$). Now, synthesizer circuit 15 receives and operates on a signal at the new and higher frequency $f_2$. Consequently, synthesizer circuit 15 will transform the new frequency $f_2$ to a frequency which corresponds to that frequency which it generated from the initial oscillator frequency $f_1$ when adjusted to supply the initial center frequency $f_c$. As a consequence of this correction of the synthesizer circuit's output frequency, $f_c$ will coincide with $f_r$, the error signal will indicate no error, and oscillator 11 will be locked at the new and higher frequency $f_2$. Of course, the output frequency of the standard will be lowered if the synthesizer circuit 15 is adjusted to transform the frequency of the signal received from oscillator 11 by an increment larger than initial increment.

Figure 2:
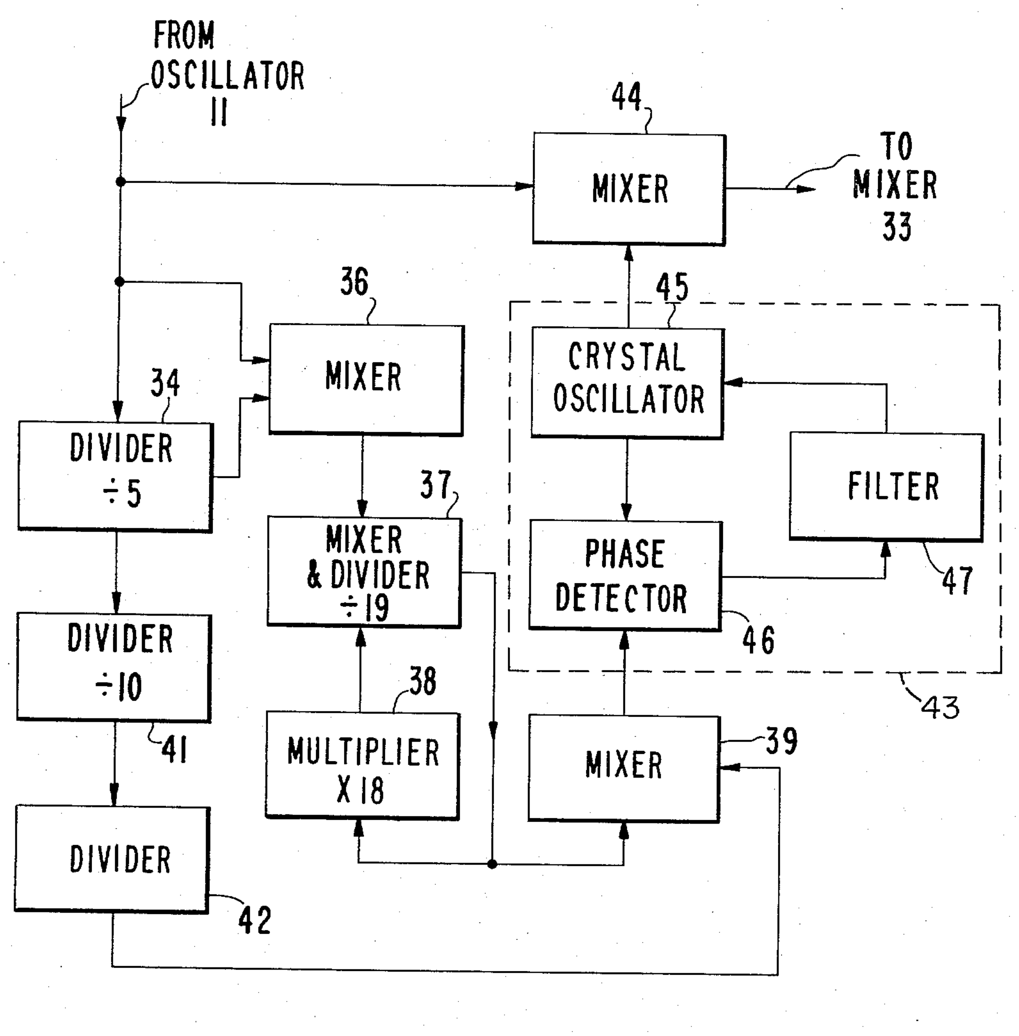
FIG. 2 is a schematic block diagram of the variable frequency synthesizer shown in FIG. 1.

One embodiment of the adjustable frequency standard of the present invention is illustrated in FIGS. 1–3. As shown in FIG. 1, resonator system 12 includes a rubidium lamp 16 whch is energized by a lamp excitation oscillator 17 to produce a collimated beam of light 18 including rubidium D lines. A rubidium filter cell 19, preferably containing the rubidium isotope 85, is positioned along the path of beam 18 to receive the beam and filter out the lower energy hyperfine component from each of the rubidium D lines. The higher energy hyperfine components of beam 18 which pass through filter 19 are then directed through a light absorption resonator 21 containing rubidium isotope 87 gas. The gas absorbs some of the higher energy light photons and thereby undergoes optical pumping. The unabsorbed light photons emerge from absorption resonator 21 and are directed to impinge an optical detector device or photocell 22 of detecting means 13. The photocell 22 responds thereto by generating an output signal proportional to the intensity of the light passing through absorption resonator 21.

A cavity resonator 23 encloses a cell 24 containing the gas medium and is excited, preferably, by a phase modulated $6834^{13}/_{19}$ megacycles per second (mc.) signal coupled thereto by an input lead 25. In a vacuum, the normal resonant frequency of rubidium 87 atomic state transition $F=2$, $M_f=0 \rightarrow F=1$, $M_f=0$ is 6,834,682,614 c.p.s. However, as will become apparent from the description of the preferred synthesizer 15, it is desirable to adjust the hyperfine transition resonance center frequency of the rubidium 87 to $6834^{13}/_{19}$ mc. This is accomplished by adjusting the buffer gas pressure of a buffer gas contained within cell 24 and a magnetic field directed axially therethrough by magnet coil 30, for example, as described in the above mentioned patent application Ser. No. 448,496. Hence, the excited cavity induces atomic state transitions in the pumped rubidium. As noted hereinbefore, the phase modulated signal causes the number of transtions, hence, the transparency of absorption resonator 21, to vary in accordance with the frequency of modulation. As was further noted, the time distribution of the transitions varies in accordance with the difference between the center frequency of the phase modulated signal and the hyperfine transition resonance center frequency. If the center and resonance frequencies coincide, an intensity pulsating light of constant pulse amplitude at a frequency equal to two times the phase modulation frequency, is transmitted through absorption resonator 21 to impinge photocell 22. If the center frequency is either greater or less than the resonance center frequency, an intensity pulsating light of alternate large and small amplitude pulses is transmitted through cell 21 to impinge photocell 22 with the frequency of the pulse amplitude variation being equal to the phase modulation frequency. The amplitude difference between the large and small amplitude pulses is proportionately related to the frequency difference between the center and resonance center frequencies while the sequence of appearance of the dfferent amplitude pulses, i.e., large first or small first, defines which side of the resonance center frequency the center frequency of the phase modulated signal lies.

A filter amplifier 26 is connected to receive the pulsating output signal from photocell 22 and to amplify only that component of the signal which corresponds to the modulation frequency. When the center and resonance center frequencies coincide, the resultant constant pulse amplitude pulsating signal issued by photocell 22 does not contain a frequency component corresponding to the modulation frequency. Hence, no signal is passed by filter amplifier 26. However, if the center frequency is on either side of the resonance center frequency, the resultant varying pulse amplitude pulsating signal issued by photocell 22 does include a frequency component corresponding to the modulation frequency. The peak amplitude of this frequency component is a measure of the difference between the center and resonance frequencies. Furthermore, when the center frequency is greater than the resonance frequency, the phase of the frequency component will be 180° out of phase with the frequency component generated when the center frequency is less than the resonance frequency.

The phase of the amplified frequency signal issued by amplifier 26 and the phase of a signal produced by a modulation oscillator reference 14 are compared by a phase detector 28 which generates a D.C. error signal whose polarity depends on the relative phases of the compared frequency signals and whose magnitude depends on the amplitude of the component of the filtered signal occurring at the modulation frequency and thereby on the deviation of the center frequency from the resonance center frequency. The phase detector is arranged so that when the center frequency of the phase modulated signal is greater than the hyperfine transition resonance center frequency, positive error voltages proportional to the frequency difference are issued from phase detector 28. On the other hand, when the center frequency is less than the resonance center frequency, negative error voltages proportional to the frequency difference are issued from phase detector 28. No error signal results when the center and resonance center frequencies coincide. The output D.C. voltage signal of the phase detector 28 is amplified by an operational amplifier 29 and coupled to a voltage controlled crystal type oscillator 11 employing a crystal cut to resonate at 5 mc. These error voltage signals alter the resonance frequency of the crystal and hence shift the frequency of oscillator 11 until the error voltage is reduced to zero, i.e., the center frequency of the transition inducing signal and the resonance center frequency coincide.

To generate the desired transition inducing signal, the 5 mc. output signal from oscillator 11 is electrically coupled to synthesizer circuit 15 which, as described in detail infra, is adjusted to selectively translate the frequency of the signal received from oscillator 11 to the particular frequency desired of the transition inducing signal. In the particular embodiment illustrated, synthesizer circuit 15 generates from the 5 mc. oscillator frequency a transition inducing signal whose frequency equals $[C \pm n\ (34\ldots \text{c.p.s.})]$ mc. where $n$ represents integers, for example from 1 to 6 and C is the base frequency adjusted to correspond approximately to the hyperfine transition frequency of the rubidium 87 and about which selective adjustments in the transition inducing signal frequency are made in steps 34 . . . c.p.s. Where a rubidium 87 gas absorption resonator 21 as described above is employed, the parameter C is adjusted to correspond to $6{,}834\frac{13}{19}$ mc.

However, as will be apparent from the following detailed description of synthesizer circuit 15, the particular circuit details may be arranged to adjust the parameter $n$ to assume other integers. Also, the particular discrete step adjustments, i.e.$\pm 34$ . . . c.p.s., of the output of synthesizer circuit 15 is a matter of choice. In the illustrated embodiment, the synthesizer circuit 15 is arranged to alter the output of the frequency standard by increments of about $\pm 50$ parts in $10^{10}$. Relative to the hereinbefore identified adjusted atomic state transition resonance frequency of rubidium, i.e. 6,834,684,211 . . . c.p.s., the $\pm 34$ . . . c.p.s. closely approximates 50 parts in $10^{10}$. Of course, where other passive or active atomic frequency resonators are employed, e.g. cesium atomic beams having a hyperfine transition resonance frequency of 9,192,-631,770 c.p.s., or hydrogen active atomic resonators having a hyperfine transition resonance frequency of 1,420,-405,751 c.p.s., adjustments of the increment of frequency translation in steps other than $\pm 34$ . . . c.p.s. would be required to adjust the frequency of the standard by $\pm 50$ parts in $10^{10}$. In any case, adjustments of 50 parts in $10^{10}$ is to be considered merely illustrative since frequency adjustments of increments other than 50 parts in $10^{10}$ can be accomplished.

One preferred apparatus for accomplishing the above described frequency synthesis comprises a variable frequency synthesizer 31 which generates from the 5 mc. frequency output of oscillator 11 an output signal having a frequency of $5\frac{6}{19}$ mc.$+n$ (34 . . . c.p.s.) or $5\frac{6}{19}$ mc.$-n$ (34 . . . c.p.s.). The output of oscillator 11 also is phase modulated by modulator 35 and electrically coupled to a times twenty-four frequency multiplier 32, e.g., a harmonic generator, which issues a 120 mc. phase modulated signal, the modulating signal being provided by reference modulation oscillator 14 at a frequency of about 107 c.p.s. The outputs of synthesizer 31 and multiplier circuit 32 are coupled to a single sideband modulator mixer and times fifty-seven frequency multiplier 33 whereas the 120 mc. phase modulated signal is multiplied to, for example, a base frequency 6840 mc. and then the $5\frac{6}{19}$ mc.$\pm n$ (34 . . . c.p.s.) signal is subtracted therefrom to yield an output signal at a frequency of $6834\frac{13}{19}$ mc.$\mp n$ (34 . . . c.p.s.). An output signal of $6834\frac{13}{19}$ mc.$\pm n$ (34 . . . c.p.s.) could also be obtained by multiplying the output frequency of oscillator 11 to a base frequency of 6,830 mc. and adjusting the variable frequency synthesizer 21 to generate a $4\frac{13}{19}$ mc.$\pm n$ (34 . . . c.p.s.) signal which is added to the base frequency. In any case, the synthesized output signal is coupled by input lead 25 to induce atomic state transitions in the rubidium-87 resonator 21.

From the foregoing, it is seen that the frequency synthesis is accomplished by generating a fixed base frequency which approaches the transition frequency of the resonator 21. This fixed base frequency is summed with a relatively low frequency, adjustable frequency signal to generate the exact desired transition inducing signal frequency. Because of the very high signal frequencies generally required to induce atomic state transitions, i.e., signals of thousands of megacycles, such a system is characterized by its simplicity and attendant accuracy. Furthermore, it is seen that as the output frequency of oscillator 11 is changed, the output frequency of variable frequency synthesizer 31 varies proportionately thereto. However, the amount of this variation relative to the $6834\frac{13}{19}$ mc. phase modulated transition inducing signal is so small that it can be neglected. Hence, for convenience, the frequency operated on by the synhethizer 31 always will be considered to be 5 mc. Furthermore, since the frequency of oscillation of oscillator 11 will be varied until the center frequency of the phase modulated signal and the transition resonance frequency are equal, the resultant summation frequency of the signal issued from mixer-multiplier circuit 33 will be a phase modulated signal having a center frequency maintained at $6834\frac{13}{19}$ mc.

Referring now to FIG. 2 there is shown the block circuit diagram of a preferred variable frequency synthesizer 31. The 5 mc. signal from the oscillator 11 is coupled to a divide-by-five frequency divider 34 and to a first signal up sideband balanced modulator mixer 36 which also receives an input from the divider 34 to provide a 6 mc. output signal. This signal is fed through a divide-by-nineteen frequency divider and single down sideband balanced modulator mixer circuit 37 producing an output signal of $\frac{6}{19}$ mc. which is multiplied by a times-eighteen frequency multiplier 38 and fed back into the mixer and divider circuit 37 for subtraction from the 6 mc. input signal. The thus stabilized $\frac{6}{19}$ mc. signal is applied to a mixer 39 which operates to generate a carrier and both upper and lower sideband frequencies. It is noted that it is preferred to use regenerative type frequency dividers for performing divisions at the above high frequencies.

The 1 mc. output signal of the divider 34 is reduced to 100 kilocycles per second (kc.) by a divide-by-ten frequency divider 41 and applied to an adjustable frequency divider switching network 42 which is shown in detail by FIG. 3. As will be described below, the divider network 42 is adjustable to generate one of a plurality of frequencies equal to *n* (34 . . . c.p.s.) where *n* represents an integer from 1 to 6.

The selected output frequency of the frequency divider network 42 is applied to the mixer 39 for combination with the $\frac{6}{19}$ mc. signal received from the mixer and divider circuit 37 producing an output signal of $\frac{6}{19}$ mc. with upper and lower sidebands. In order that the transition inducing signal frequency can be adjusted either by a $+n$ (34 . . . c.p.s.) or $-n$ (34 . . . c.p.s.), means 43 are provided for selecting one of the sideband component signals, e.g., $\frac{6}{19}$ mc.$+n$ (34 . . . c.p.s.), issuing from mixer 39 for application to a second single up sideband balanced modulator mixer 44. The mixer 44 adds the selected signal to a 5 mc. signal received from oscillator 11 to generate the $5\frac{6}{19}$ mc.$\pm n$ (34 . . . c.p.s.) signal which is coupled to mixer and multiplier 33. In the case of the above noted example, the frequency is $5\frac{6}{19}$ mc.$+n$ (34 . . . c.p.s.).

The particular selecting means shown employs a frequency adjustable oscillator 45 which can be adjusted to frequencies corresponding to $\frac{6}{19}$ mc.$\pm n$ (34 . . . c.p.s.). The frequency of oscillation of oscillator 45 can be adjusted by shunting the crystal electrodes with a variable reactance (see Electronic and Radio Engineering by Frederick E. Terman, published by McGraw-Hill Book Company, New York, 4th edition, 1955, pp. 518–519), or more simply, by crystal replacement. In either case, the output frequency of crystal oscillator 45 is adjusted to the selected frequency and compared to the output from mixer 39, which serves as a reference frequency, at a phase detector 46 which responds by generating a D.C. plus sideband control signal for locking the oscillator 45 to the selected frequency. The locking is accomplished by filtering out the sideband component of the control signal issuing from phase detector 46 with a filter 47 while passing the D.C. component to, for example, affect adjustment of a variable reactance shunting the crystal electrodes of oscillator 45. The resultant D.C. signal servos the crystal oscillator 45 to correct it precisely to the selected frequency of either $\frac{6}{19}$ mc.$+n$ (34 . . . c.p.s.) or $\frac{6}{19}$ mc.$-n$ (34 . . . c.p.s.).

Other selector means 43 can be employed to accomplish the frequency selection. For example, high and low pass parallel connected filters could be used to separate the upper and lower sideband components of the signal issuing from mixer 39. The selection would be accomplished by appropriate switching means coupled to allow one of the components to pass to mixer 44.

Reference is now made to a preferred frequency divider switching network 42 shown in FIG. 3. The 100 kc. signal from the divider 41 is fed through a pair of frequency divider circuits 51′ and 51″ producing an output signal of approximately 2040 c.p.s. This signal is fed into a 7 position switching network 52. The first position of the switching network 52 establishes an open circuit and provides no output signal to the mixer 39. The operation of the invention with the switching network 52 in this first switch position is exactly as described in the above mentioned U.S. patent application No. 448,496. In the second switch position, the 2040 c.p.s. signal is passed through the frequency dividers 53, 54, 55 and 56 producing an output signal of 34 . . . c.p.s. In the third switch position the 2040 . . . c.p.s. signal is passed through the frequency dividers 53, 54 and 56 producing an output signal of 68 . . . c.p.s. The fourth switch position feeds the 2040 . . . c.p.s. signal through the frequency dividers 53, 55 and 56 producing an output signal of 102 . . . c.p.s. In the fifth switch position the 2040 . . . c.p.s. signal passes through the frequency dividers 53 and 54 producing an output signal of 136 . . . c.p.s. The sixth switch position feeds the 2040 . . . c.p.s. output signal through the frequency dividers 54, 55 and 56 producing an output signal of 170 . . . c.p.s. The seventh and final switch position feeds the 2040 . . . c.p.s. signal through the frequency dividers 53 and 56 producing a 204 . . . c.p.s. output signal. Thus, selection of a given switch position for the frequency generator switching network 52 permits the application to the mixer 39 of any given one of the integral frequencies *n* (34 . . . c.p.s.) where *n* represents an integer from 1 to 6. The operation of switching network 52 is synchronized with the frequency controller of oscillator 45 such that frequency of the signal issuing from mixer 39 corresponds to that being generated by oscillator 45. The above lower frequency dividers employed in divider switching network 42 preferably are digital dividers.

The switching network 52 is utilized when it is necessary to adjust the frequency of the standard. For example, UT–2 time may change +50 parts in $10^{10}$. Such a change requires a downward correction in the frequency of the standard, hence oscillator frequency. In this event, the second switch position of the switching network 52 is selected resulting in an output signal of 34 . . . c.p.s. This signal is added to the $\frac{6}{19}$ mc. to produce a $\frac{6}{19}$ mc. with upper and lower sidebands of 34 . . . c.p.s. The oscillator 45 is adjusted so that the $\frac{6}{19}$ mc. $-34$ . . . c.p.s. signal issues to mixer 44. Through the operation of mixers 44 and 33, the 34 . . . c.p.s. signal is added to the $6834\frac{13}{19}$ mc. signal normally coupled into the cavity resonator 23. The 34 . . . c.p.s. relative to the 6,834,684,211 . . . c.p.s. adjusted atomic resonant frequency of rubidium closely approximates the 50 parts in $10^{10}$ change in the UT–2 time scale. If additional very small adjustments are necessary, they can be accomplished, for example, by very small adjustments of the magnetic field applied to the resonator. Similarly for a change in real time equivalent to +100 parts in $10^{10}$, the third position of switching network 52 will provide a compensating 68 c.p.s. signal for the resonant reference frequency. In the same manner the other frequencies of 102, 136, 170, and 204 c.p.s. can be provided by the switching network 52 as desired. In all these cases of an increasing UT–2 second, the output frequency of oscillator 11 will be adjusted downward by 50 parts in $10^{10}$ in the manner described hereinabove. Of course, when it is necessary to adjust the frequency of oscillator 11 to higher frequencies, as a result of a decreasing UT–2 second, oscillator 45 would be adjusted so that the $\frac{6}{19}$ mc. +34 . . . c.p.s. signal issues to mixer 44 whereby the 34 . . . c.p.s. signal eventually is subtracted from the $6834\frac{13}{19}$ mc. signal.

It is noted that the entire synthesizer operates with rational numerical means, i.e., multipliers, dividers and summers, to generate a $6834\frac{13}{19}$ $mc.\pm n$ (34 . . . c.p.s.) atomic state transition inducing signal from an adjustable 5 mc. oscillator. Such rational operating frequency synthesizers can be devised to transform any given frequency to a desired quantum mechanical transition frequency.

While the present invention has been described in detail with reference to a single embodiment, many modifications are possible within the scope of the invention. For example, the emission characteristics of active atomic frequency resonators such as hydrogen and ammonia masers may be employed to stabilize and control the output frequency of oscillator 11. In such a system, a phase comparison can take place at the hyperfine transition frequency of the resonant medium, or more conveniently at some lower frequency obtained by reducing the frequency signal generated by the resonant medium and the synthesized frequency derived from oscillator 11 with conventional frequency converters. Similarly, the beam transmission of passive atomic frequency resonators, such as a cesium atom beam resonator, can be monitored relative to the phase modulated transformed frequency signal to generate the controlling error signal.

Hence, the scope of the present invention is not intended to be limited except by the terms of the following claims.

What is claimed is:

1. In an adjustable frequency synthesizer for use with frequency standards which include a resonator serving as a standard to which an oscillator generating a selected output frequency is locked, the combination comprising a plurality of frequency dividers, switching means for selectively coupling certain ones of said dividers to receive said output from said oscillator and reduce the frequency thereof by a selected amount, frequency multiplier means coupled to receive said output from said oscillator and generate an output whose frequency is a multiple of said oscillator frequency, and frequency summation means coupled to receive the outputs from said dividers and multiplier and provide an output signal having a frequency equal to the summation thereof for inducing transitions in said resonator.

2. The frequency synthesizer according to claim 1 further comprising phase modulation means in circuit connection with said oscillator, frequency multiplier and frequency summation means for modulating the signal being delivered from said oscillator to said frequency summation means.

3. The frequency synthesizer according to claim 2 further comprising a frequency divider means coupled to receive said oscillator output and generate an output of a selected lower frequency, frequency mixer means coupled to receive the output from said divider means and the output issued from said certain dividers and provide an output signal including upper and lower sideband frequency components, and means for selectively coupling one of said sideband components to said frequency summation means.

4. The frequency synthesizer according to claim 3 wherein said sideband selecting means includes an adjustable frequency oscillator adjusted to generate a frequency corresponding to said selected sideband frequency, and means for comparing the generated frequency of said adjustable frequency oscillator and the selected sideband from said mixer to lock said adjustable frequency oscillator to said selected frequency, the output of said adjustable frequency oscillator coupled to said frequency summation means.

5. A frequency adjustable stabilized frequency standard comprising an atomic frequency resonator providing a signal at a frequency corresponding to a quantum mechanical transition resonance frequency, a variable frequency oscillator for generating a frequency standard signal at a selected frequency, an adjustable frequency divider means coupled to said variable frequency oscillator to provide a divided frequency signal which is a selected quotient of the frequency provided by said variable frequency oscillator, means responsive to said selected frequency and said divided frequency signals to provide a signal at a frequency corresponding to the combination of said selected frequency and divided frequency, and means for comparing of said combined frequency signal to said quantum mechanical transition resonance frequency to generate an error signal representative of their frequency difference for tuning said variable frequency oscillator to a frequency relative to said frequency difference.

6. The frequency adjustable stabilized frequency standard according to claim 5 wherein said means responsive to the selected frequency and the divided frequency signals includes a frequency multiplier in circuit connection with said variable frequency oscillator to provide a multiplied frequency signal which is a selected multiple of the frequency provided by the variable frequency oscillator, and a frequency summation means coupled to receive the multiplied and divided frequency signals and provide said combined frequency signal at a summation thereof.

7. The frequency adjustable stabilized frequency standard according to claim 6 wherein said adjustable frequency divider means includes a plurality of frequency dividers, each divider adjusted to divide the oscillator's frequency by a rational number, and switching means for connecting certain ones of said dividers to receive the signal from said variable frequency oscillator and provide said divided frequency signal at a selected frequency.

8. A frequency adjustable stabilized frequency standard comprising an atomic frequency resonator providing a signal at a frequency corresponding to a quantum mechanical transition resonance frequency, a variable frequency oscillator for generating a frequency standard signal at a first selected frequency, an adjustable frequency oscillator whose frequency of oscillation is adjustable in frequency increments for generating a signal at a second selected frequency, means responsive to said variable frequency oscillator for providing a reference frequency signal adjustable in frequency increments corresponding to the frequency increment adjustments of said adjustable frequency oscillator, means responsive to said reference frequency signal for locking said adjustable frequency oscillator to said second selected frequency, means responsive to said variable frequency oscillator and adjustable frequency oscillator signals to provide a signal at a frequency corresponding to a combination of the first and second selected frequencies, and means for comparing the frequency corresponding to the combined selected frequencies to said quantum mechanical transition resonance frequency to generate an error signal representative of their frequency difference for tuning said variable frequency oscillator to a frequency relative to said frequency difference.

9. The frequency adjustable stabilized frequency standard according to claim 8 wherein said means for providing the reference frequency includes an adjustable frequency divider means in circuit connection with said variable frequency oscillator for dividing the frequency of the signal generated thereby to provide said reference frequency signal at a selected quotient thereof.

10. The frequency adjustable stabilized frequency standard according to claim 9 further comprising a frequency divider means responsive to said variable frequency oscillator to provide a signal at a selected lower frequency, frequency mixer means coupled to receive the signal from said divider means and the signal issued from said adjustable frequency divider and provide a signal including upper and lower sideband components to said adjustable frequency oscillator to lock said adjustable oscillator to said second selected frequency.

11. The frequency adjustable stabilized frequency standard according to claim 10 wherein said sideband selecting means includes means for comparing the generated frequency of said adjustable frequency oscillator and the selected sideband from said mixer to generate an error signal for locking said adjustable frequency oscillator to said selected frequency.

12. The frequency adjustable stabilized frequency standard according to claim 9 wherein said adjustable frequency divider includes a plurality of frequency dividers, each divider adjusted to divide the variable frequency oscillator's frequency by a selected number, a switching network in circuit connection with said variable frequency oscillator and having a plurality of switch positions for selectively connecting certain ones of said dividers to receive the signal from the variable frequency oscillator and provide said reference frequency signal at a selected frequency, and wherein said means responsive to said variable frequency oscillator and said adjustable frequency oscillator signals includes a frequency multiplier coupled to receive said signal from said variable frequency oscillator and adapted to provide an output signal at a frequency which is a selected multiple of said oscillator frequency, and a frequency summation means responsive to the output signal from said frequency multiplier and the signal from said adjustable frequency oscillator to provide said combined frequency signal having a frequency equal to the summation of the frequencies of said signals received.

13. The frequency adjustable stabilized frequency standard according to claim 12 where said variable frequency oscillator is a voltage controlled crystal oscillator employing a 5 mc. crystal, said dividers selectively divide said variable frequency oscillator frequency to generate an output signal whose frequency is adjustable in steps of approximately 34 c.p.s., said frequency multiplier is adapted to multiply the frequency of said variable frequency oscillator by 1368, said frequency divider means adjusted to provide a $\frac{9}{19}$ mc. output signal, and further comprising phase modulator serially coupled with said frequency multiplier and variable frequency oscillator and cooperating therewith to provide a phase modulated signal having a center frequency at 1368 times the frequency of the variable frequency oscillator.

14. The frequency adjustable stabilized frequency standard according to claim 13 wherein said atomic frequency resonator includes a light absorption cell enclosed within a cavity resonator and whose atoms are responsive to light at a selected frequency by being excited to a high energy state, and a light source for generating a beam of light at said selected frequency and directing it to impinge said absorption cell, and wherein said frequency comparison means includes means for coupling said signal corresponding to the combined first and second selected frequencies to said cavity resonator to induce selected atomic state transitions the number of which varies in accordance with the frequency of the modulated signal coupled thereto thereby causing the amount of light absorbed by said cell to vary accordingly, and light intensity detector means for detecting the intensity of said light beam passing through said absorption cell to generate said error signal representative of the number and time distribution of said atomic state transitions.

15. The frequency adjustable stabilized frequency standard according to claim 14 wherein said light absorption cell is a rubidium isotope 87 gas cell, and said light source includes a rubidium isotope 87 lamp excited by a lamp excitation oscillator to generate a beam of light directed through a rubidium isotope 85 filter cell to impinge said gas cell.

16. The frequency adjustable stabilized frequency standard according to claim 14 wherein said light intensity detector is a photocell, and including an electronic filter coupled to receive the signal from said photocell, said filter tuned to pass only signals having a frequency equal to the modulation frequency, a phase detector coupled to receive said signals passed by said filter and a signal from the phase modulator and compare the phase and amplitude of said signals to generate an error signal representative of the frequency difference between said center and resonance frequencies, said error signal coupled to tune said oscillator to said selected frequency.

References Cited

UNITED STATES PATENTS

| | | | |
|---|---|---|---|
| 2,964,715 | 12/1960 | Winkler | 331—3 |
| 3,021,448 | 2/1962 | Daly | 331—3 X |
| 3,166,888 | 1/1965 | Kartaschoff | 331—3 X |
| 3,243,721 | 3/1966 | Caldwell | 331—3 |

NATHAN KAUFMAN, *Acting Primary Examiner.*

ROY LAKE, *Examiner.*

S. H. GRIMM, *Assistant Examiner.*